United States Patent [19]

Geiger et al.

[11] Patent Number: 4,702,592
[45] Date of Patent: Oct. 27, 1987

[54] RETICLE ASSEMBLY, SYSTEM, AND METHOD FOR USING THE SAME

[75] Inventors: David J. Geiger, Shelton; Sunny Lee, Milford; Eric Busch, Hamden, all of Conn.

[73] Assignee: ITT Corporation, New York, N.Y.

[21] Appl. No.: 879,890

[22] Filed: Jun. 30, 1986

[51] Int. Cl.⁴ .............................................. G03B 27/42
[52] U.S. Cl. ........................................ 355/53; 355/54
[58] Field of Search ..................................... 355/53, 54

[56] References Cited

U.S. PATENT DOCUMENTS

| | | | |
|---|---|---|---|
| 4,128,331 | 12/1978 | Nakamura | 355/53 |
| 4,573,791 | 3/1986 | Phillips | 355/53 |
| 4,613,230 | 9/1986 | Iwai | 355/53 |
| 4,620,785 | 11/1986 | Suzuki et al. | 355/53 |

Primary Examiner—Monroe H. Hayes
Attorney, Agent, or Firm—T. L. Peterson

[57] ABSTRACT

A reticle assembly, exposure system, and method for exposing each of a plurality of levels of a single die or device dies of a semiconductor wafer to a pattern of radiation on a site-by-site exposure basis are disclosed. Radiation patterning means between a source of radiation and the semiconductor wafer pattern the radiation onto the semiconductor wafer and a stepping means incrementally moves the semiconductor wafer relative to the patterning means for exposing the device dies, one at a time, in succession. The patterning means includes a reticle assembly having a plurality of reticles arranged in a coplanar array with each reticle having a respective different die exposure pattern.

6 Claims, 9 Drawing Figures

RETICLE ASSEMBLY, SYSTEM, AND METHOD FOR USING THE SAME

BACKGROUND OF THE INVENTION

The present invention relates to a new and improved reticle assembly, system, and method for use in the manufacture of semiconductor devices. The present invention more particularly relates to a reticle assembly, system, and method for exposing each of a plurality of device dies of a semiconductor wafer to a pattern of radiation on a site-by-site exposure basis using a reticle having a plurality of sites wherein each site is for a different device, a different level of the same device and/or a cluster of the same level of a device.

Processes for manufacturing semiconductor devices, such as discrete devices and integrated circuits, hereinafter referred to generally as devices, have become highly developed in the art. In general, the devices are formed in semiconductor wafers, which can be two to twelve inches in diameter, by diffusing various impurities into selected regions of the wafers to form the devices and by depositing metal onto the wafers in discrete regions to provide circuit interconnects. In such processes, the wafer is subdivided into a plurality of small discrete areas, referred to as dies, with each die corresponding to one of the devices. The wafers are processed in tact until the dies have been finally processed, at which point, the wafer is scribed or otherwise physically cut into the aforementioned dies. The dies are thereafter mounted into suitable packages having external pins which are connected internally to die bonding pads. Thereafter, the packages are encapsulated and ready for use.

To define the discrete regions of the dies wherein impurities are diffused or whereon metal is to be deposited, photolithographic techniques are generally employed. In such a process, a radiation sensitive material, such as a photoresist which is sensitive to a given source of irradiation, is coated over the wafers. The wafers are then exposed to the given irradiation, such as ultraviolet light irradiation, electron beam irradiation, or x-ray irradiation through a mask or reticle which has a pattern of opaque and transparent areas so that the radiation source impinges upon the photoresist in only those areas defined by the transparent areas. After exposure, the wafers are subjected to a suitable developer which removes the photoresist in those areas which were exposed or not exposed, depending upon whether a positive or negative photoresist was used. As a result, discrete areas of the wafers are left covered by photoresist and the other areas are rendered uncovered to ultimately permit diffusion of impurities into the uncovered areas or deposition of metal over the uncovered areas.

One process for exposing the wafers through a reticle to a source of radiation, such as ultraviolet light, for example, is a projection and step and repeat process wherein the reticle defines the radiation pattern for each die. Also, optics may be used so that the reticles can be physically larger in dimension than the die size. The optics reduce the reticle dimension to the die size and forms the reticle pattern on the wafers. Hence, because the reticles can be larger than the die size, very small feature sizes, down to less than one micron, can be obtained. Because the ultimate pattern image has the dimensions of the die, the wafer is generally incrementally moved relative to the reticle on a step and repeat basis so that the entire wafer is exposed to the reticle pattern on a site-by-site exposure basis.

Usually, many such exposure steps are required in manufacturing semiconductor devices. This results because the devices include many different elements which are formed in levels within the semiconductor wafers. Each such level requires a separate exposure, and each such exposure therefore requires a respective different reticle. It is not unusual for a device to require twelve different exposures and thus twelve different reticles.

Because high precision is required in making reticles, the cost of making reticles is quite high. This high cost can be tolerated in high volume, mass production environments, but can be exorbitant for low volume production environments, such as in making custom devices or making devices during device design and development

SUMMARY OF THE INVENTION

The present invention provides a reticle assembly for use in the manufacture of semiconductor devices for exposing each of a plurality of levels of a single die or device dies of a semiconductor wafer to a pattern of radiation on a site-by-site exposure basis. The reticle assembly includes a plurality of reticles arranged in a coplanar array with each reticle having a respective different exposure pattern.

The present invention further provides an exposure system for use in the manufacture of semiconductor devices for exposing each of a plurality of levels of a single die or device dies of a semiconductor wafer to a pattern of radiation on a site-by-site exposure basis. The system includes a source of the radiation, radiation patterning means between the source of radiation and the semiconductor wafer for patterning the radiation onto the semiconductor wafer, and stepping means for incrementally moving the semiconductor wafer relative to the patterning means for exposing each device die, one at a time, in succession. The patterning means includes a reticle assembly including a plurality of reticles arranged in a coplanar array with each reticle having a respective different die exposure pattern.

The present invention further provides a method of exposing each of a plurality of levels of a single die or device dies of a semiconductor wafer to a pattern of radiation on a site-by-site exposure basis. The method includes the steps of providing a source of the radiation, providing radiation patterning means between the source of radiation and the semiconductor wafer wherein the patterning means includes a reticle assembly including a plurality of reticles arranged in a coplanar array with each reticle having a respective different die exposure pattern, selecting a given one of the reticles to expose the wafer to the die exposure pattern of the given one of the plurality of reticles, and incrementally moving the semiconductor wafer relative to the patterning means to expose each device die, one at a time, in succession to the die exposure pattern of the given one of the reticles.

DETAILED DESCRIPTION

Figure 1:
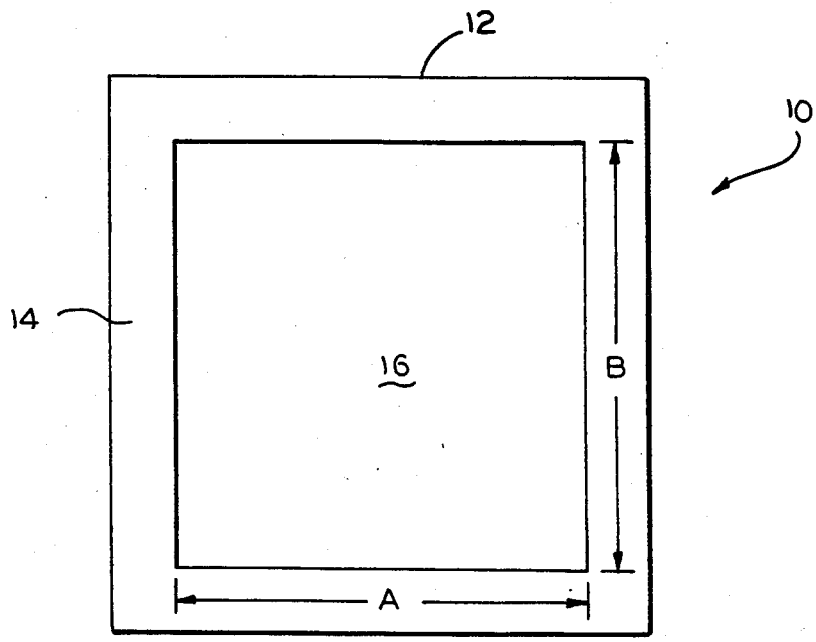
FIG. 1 is a top plan view of a prior art reticle assembly.

Referring now to FIG. 1, it illustrates a prior art reticle 10. The reticle 10 includes a substrate 12 which is transparent to the irradiation source and having an opaque marginal portion 14. The opaque marginal portion 14 can be formed from, for example, chromium and defines a useable inner reticle area 16 having dimensions A by B. The effective reticle area 16, although not illustrated, generally includes a pattern of opaque and transparent portions which define the mask pattern of the reticle 10.

Generally, reticles such as reticle 10 have an effective area dimension which is greater in dimension than the dies to be exposed on a semiconductor wafer. Optical systems within the equipment utilizing the reticles reduce the reticle image contained within the useable area 16 to an exposure image pattern having the same dimensions as the dimensions of the dies of the wafers.

Figure 2:
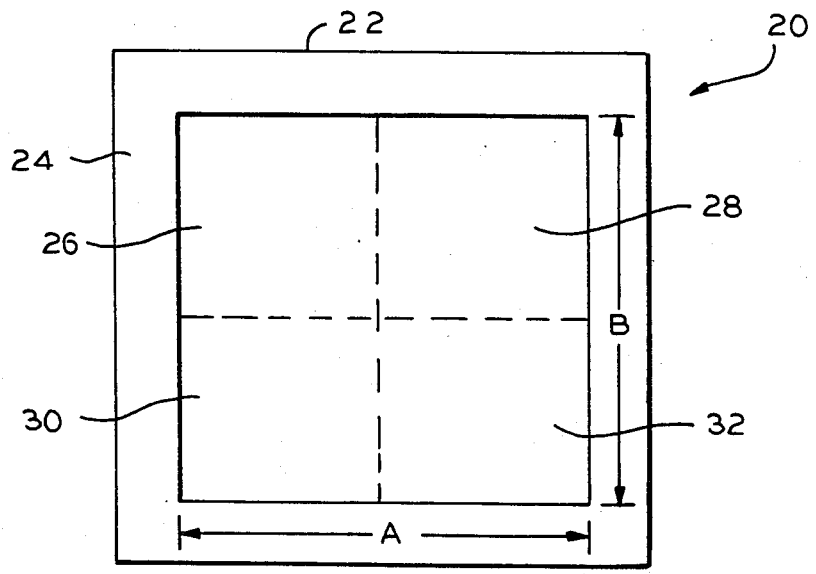
FIG. 2 is a top plan view of a reticle assembly embodying the present invention having four reticles arranged in a coplanar array with each reticle having a respective different exposure pattern.

Referring now to FIG. 2, it illustrates a reticle assembly 20 embodying the present invention. The reticle assembly 20 includes a substrate 22 which is transparent to the irradiation source and having a marginal opaque portion 24. The marginal opaque portion 4 defines a useable reticle area having the dimensions of A by B which correspond to the A by B dimensions of the reticle 10 of FIG. 1. However, within the useable reticle area of the reticle 20, there are formed a plurality of reticles or sites, and, in accordance with this preferred embodiment, four reticles or sites 26, 28, 30, and 32. Each of the reticles 26, 28, 30 and 32 has a respective different exposure pattern therein. Although the effective useable reticle area of each of the reticles 26, 28, 30, and 32 is smaller than the useable reticle area 16 of the reticle 10 of FIG. 1, the optics within the exposure system can be arranged to compensate for this difference. As a result, because each of the reticles 26, 28, 30, and 32 have a different exposure pattern, the reticle 20 can be utilized for exposing four different levels of the same device or a level of four different devices, or a combination thereof. In contrast, the reticle 10 of FIG. 1 can be used for just one device level exposure. Hence, for manufacturing a semiconductor device which requires twelve exposures, twelve reticles like that shown in FIG. 1 would be required whereas only three reticles as shown in FIG. 2 would be required.

Figure 3:
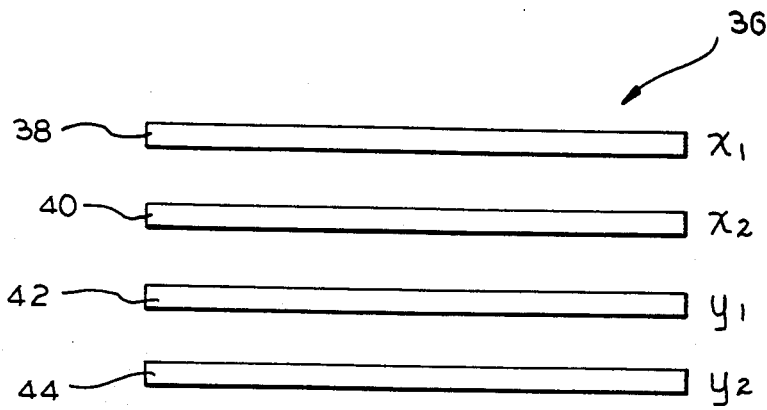
FIG. 3 is a side plan view of a blade system embodying the present invention which can be utilized in selecting a given one of the reticles of the reticle assembly of FIG. 2.
Figure 4:
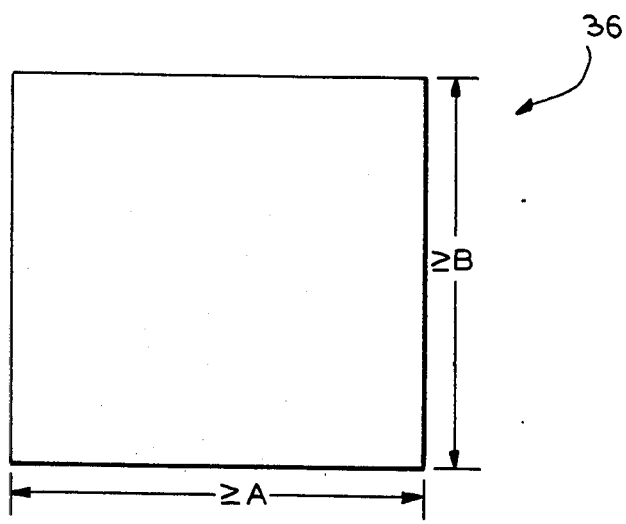
FIG. 4 is a top plan view of the blade system of FIG. 3.

In utilizing the reticle assembly of the present invention as illustrated in FIG. 2, it is necessary to provide a means for selecting a given one of the reticles. FIG. 3 illustrates such a system. FIG. 3 illustrates a blade system 36 comprising four blades 38, 40, 42, and 44 which are also designated $X_1$, $X_2$, $Y_1$, and $Y_2$ respectively. Each of the blades 38, 40, 42, and 44 as can be seen in FIG. 4 has a width dimension which is equal to or greater than A and a height dimension which is equal to or greater than B wherein A and B are the dimensions of the useable reticle area of the reticle assembly 20 of FIG. 2. The secondary designations $X_1$, $X_2$, $Y_1$, and $Y_2$ serve to indicate the direction in which the blades are arranged to move for selecting a given one of the reticles 26, 28, 30 and 32 of the reticle assembly 20 of FIG. 2. In accordance with this preferred embodiment, the $X_1$ blade 38 is arranged to move to the left as seen from above, the $X_2$ blade 40 is arranged to move to the right as seen from above, the $Y_1$ blade 42 is arranged to move in a downward direction as seen from above, and the $Y_2$ blade 44 is arranged to move in the upward direction as seen from above. In order to achieve maximum precision focusing during the use of the reticle 20 of FIG. 2, it is also preferred that each of the blades 38, 40, 42, and 44 be moveable completely out of the path of the reticle assembly or at least the useable reticle area of the reticle assembly to permit all four reticles to be used during alignment and focusing.

Figure 5:
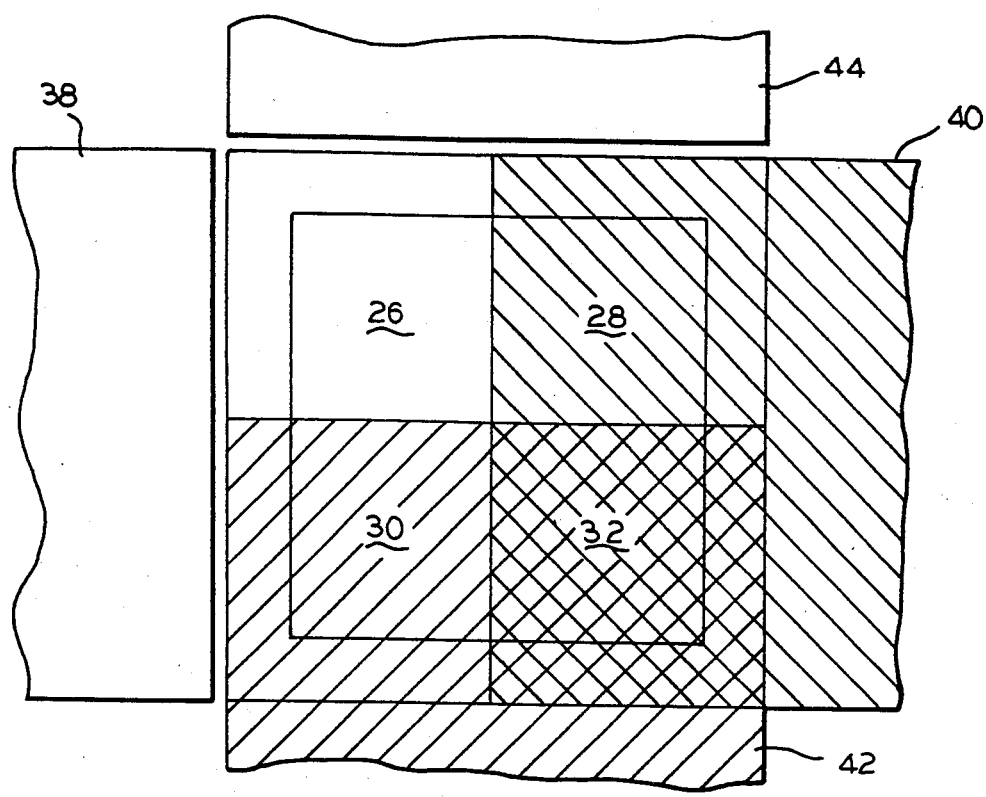
FIG. 5 is a schematic top plan view illustrating the manner in which the blade system of FIGS. 3 and 4 can be utilized to select a first reticle of the reticle assembly of FIG. 2.
Figure 6:
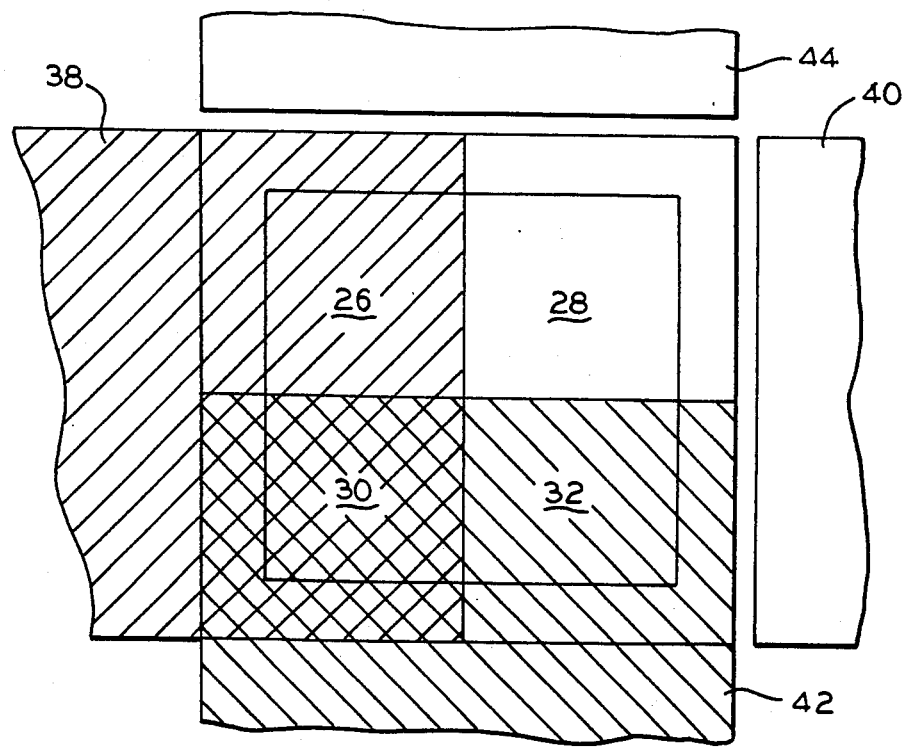
FIG. 6 is a schematic top plan view illustrating the manner in which the blade system of FIGS. 3 and 4 can be utilized to select a second reticle of the reticle assembly of FIG. 2.
Figure 7:
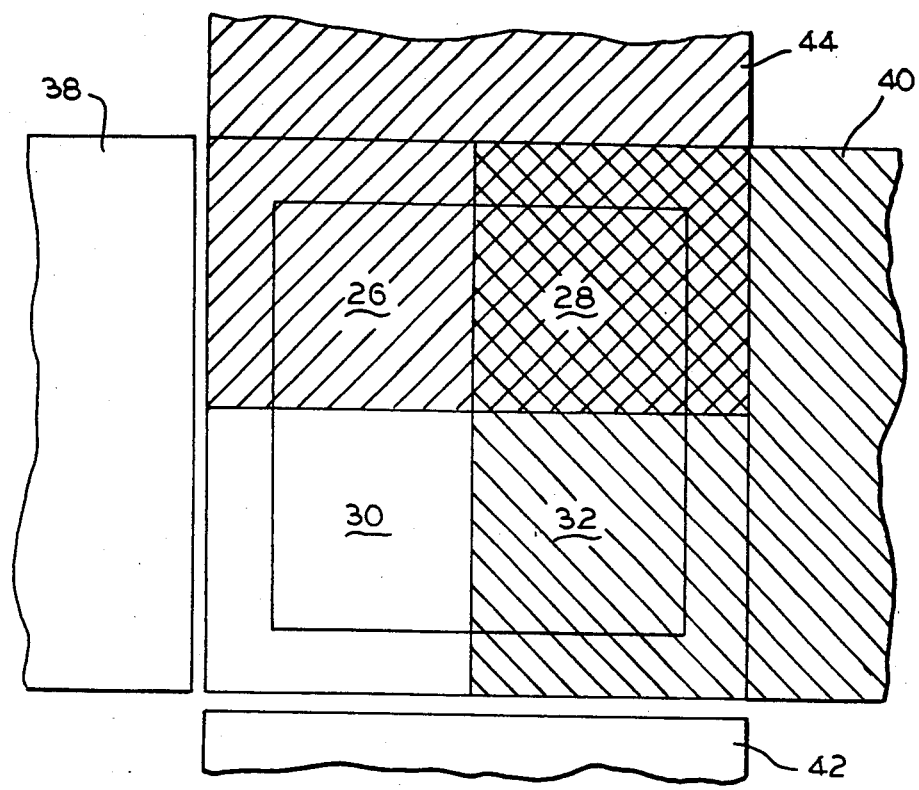
FIG. 7 is a schematic top plan view illustrating the manner in which the blade system of FIGS. 3 and 4 can be utilized to select a third reticle of the reticle assembly of FIG. 2.
Figure 8:
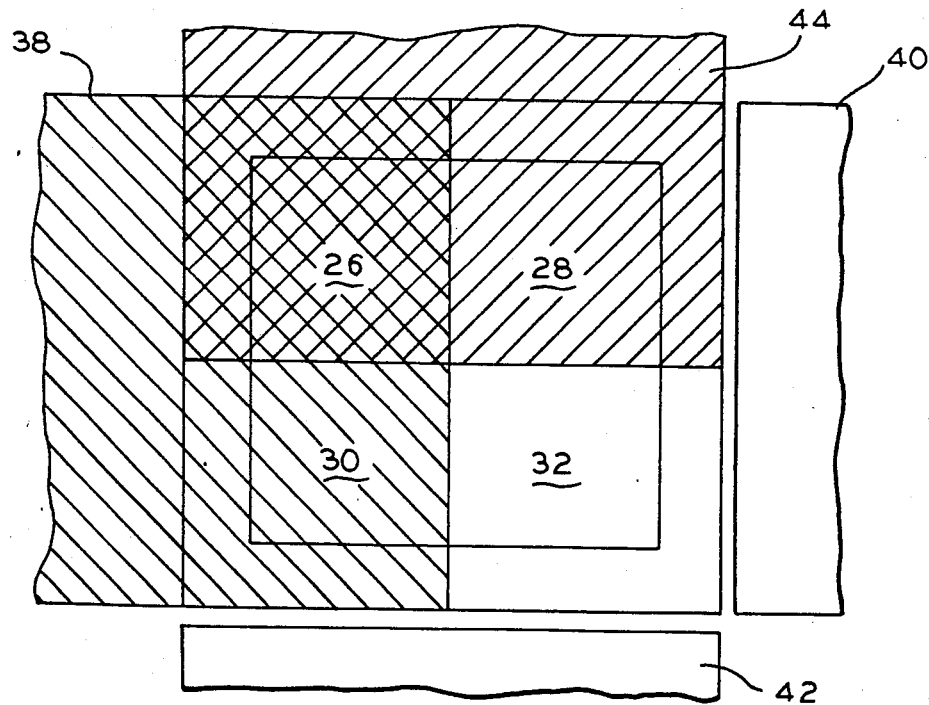
FIG. 8 is a schematic top plan view illustrating the manner in which the blade system of FIGS. 3 and 4 can be utilized to select a fourth reticle of the reticle assembly of FIG. 2.

Referring now to FIGS. 5 through 8, they illustrate how each of the reticles 26, 28, 30 and 32 can be selected by using the blade system 36 illustrated in FIGS. 3 and 4. In FIG. 5, the reticle 26 is selected by moving the $X_1$ blade 38 and the $Y_2$ blade 44 out of the useable reticle area. The $Y_1$ blade 42 is moved downwardly by half of the width of the useable reticle area and the $X_2$ blade 40 is moved to the right by half of the width of the useable reticle area. In FIG. 6, the reticle 28 is selected by moving the $X_2$ blade 40 and the $Y_2$ blade 44 out of the useable reticle area and by moving the $X_1$ blade 38 to the left by half the width of the useable reticle area and the $Y_1$ blade 42 downwardly by half the height of the useable reticle area. In FIG. 7, the reticle 30 is selected by moving the $X_1$ blade 38 and the $Y_1$ blade 42 out of the useable reticle area, by moving the $Y_2$ blade 44 upwardly by half the height of the useable reticle area and by moving the $X_2$ blade 40 to the right by half the width of the useable reticle area. Lastly, FIG. 8 illustrates how reticle 32 is selected by moving the $X_2$ blade 40 and the $Y_1$ blade 42 out of the useable reticle area, by moving the $Y_2$ blade 44 upwardly by half the height of the useable reticle area and by moving the $X_1$ blade 38 to the left by half the useable reticle area.

As previously mentioned, each of the blades 38, 40, 42, and 44 are preferably arranged for full travel across the useable reticle area in their respective directions. However, the blades can then be moved to their designated positions to close off or block the unwanted reticles just prior to exposure so that the reticle assembly can be accurately masked off to utilize only the given one of the reticles desired. As a result, the blade system 36 is capable of masking any rectangular area of the reticle assembly 20. As a result, additional reticles could be employed within the useable reticle area of the reticle assembly 20 if desired.

The present invention can also be practiced with blade systems which have restricted blade movement of one of the X and Y blades but full travel of the opposite X and Y blades. However, such a system would need to allow 180° rotation of the reticle assembly to provide complete utilization of the reticle assembly.

Figure 9:
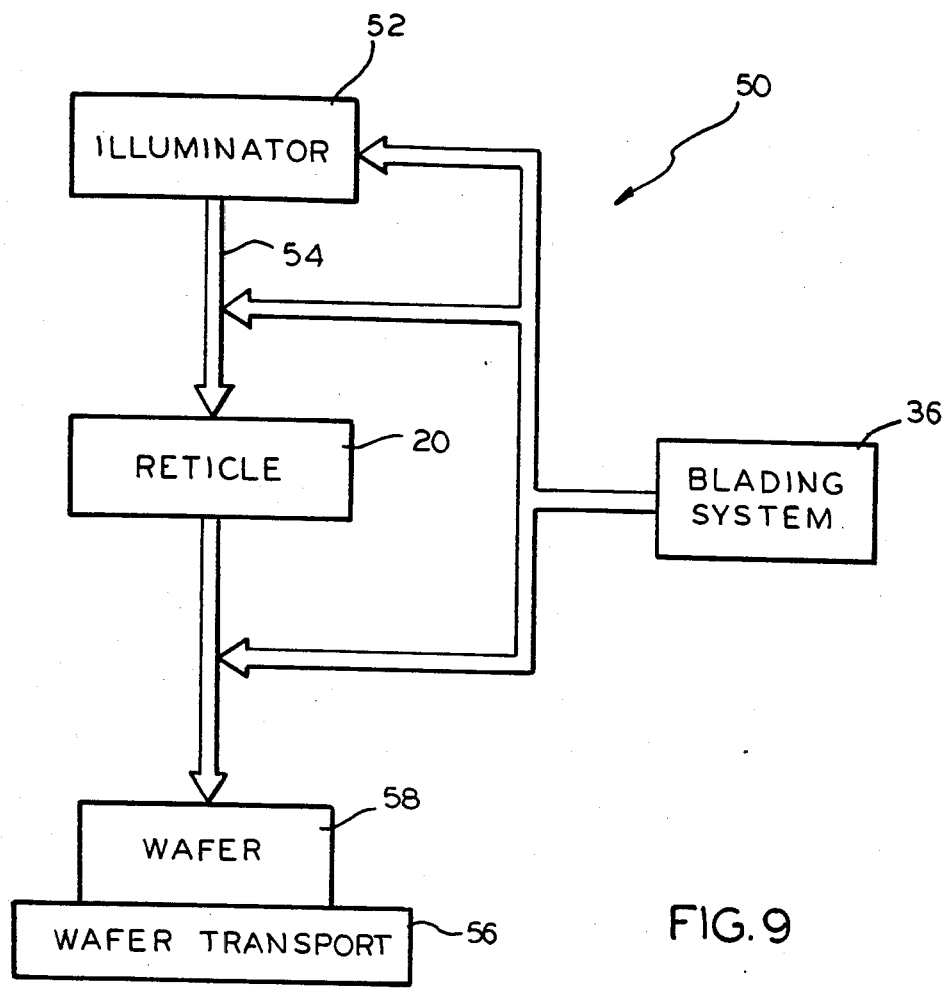
FIG. 9 is a block diagram illustrating an exposure system embodying the present invention which employs the reticle of FIG. 2 and the blade system illustrated in FIGS. 3 and 4.

As previously mentioned, the reticle assembly 20 and blade system 36 can be utilized to advantage in the making of semiconductor devices. Such a reticle assembly and blade system can be incorporated into commercially available mask aligners, such as, the "Fine Pattern Projection Mask Aligner" FPA-1500 or FPA-1550 manufactured by Canon Inc. FIG. 9 illustrates how the reticle assembly 20 and blade system 36 can be so incorporated.

The system 50 of FIG. 9, which is a schematic block diagram of a mask aligner such as the mask aligners referred to above, generally includes an illuminator 52, a reticle assembly 20, a wafer transport 56 upon which a wafer 58 rests, and the blading system 36. The illuminator 52 can include, for example, a high pressure mercury lamp, a shutter, and various lenses, mirrors, and filters to provide at the output of the illuminator a well collimated source of light having preferably light of a single wavelength. The reticle assembly 20 is disposed between the illuminator 52 and the wafer 58 within the path of light indicated at 54. The wafer transport 56 is arranged to move in an X and Y direction for incrementally moving the wafer 58 to enable exposure of the wafer on a die-by-die basis wherein each die is exposed to the radiation pattern defined by the selected reticle of the reticle assembly 20. As also indicated in FIG. 9, the blading system 36 can be located within the illuminator 52, between the illuminator 52 and the reticle assembly 20, or between the reticle assembly 20 and the wafer 58. If the blading system 36 is to be located within the illuminator 52, it should be located within the illuminator down stream in the direction of the flow of light from the high pressure memory lamp and preferably intermediate the shutter of the system and the illuminator output.

In utilizing the system 50 of FIG. 9 in the manufacture of semiconductor devices, it is assumed that the wafer 58 has coated thereon a photoresist. The illuminator 52 is then energized and all of the blades of the blade system 36 are retracted so that the entire useable reticle area of the reticle assembly 20 can be utilized to provide for focusing and alignment. Thereafter, the desired reticle of the reticle assembly 20 is selected by selectively moving the blades of the blading system 36 as previously described. Once this has occurred, the wafer transport can move the wafer 58 to a starting position at which point, the wafer transport can incrementally move the semiconductor wafer relative to the reticle assembly 20 to permit exposure of each of the device die, one at a time, in succession.

As can be seen from the foregoing, the present invention provides a new and improved reticle assembly, exposure system, and method for exposing each of a plurality of device dies of a semiconductor wafer to a pattern of radiation on a die-by-die exposure basis in the manufacture of semiconductor devices. Because the reticle assembly includes a plurality of reticles, each having respective different die exposure pattern, the number of reticles required in manufacturing a given device is drastically reduced. As a result, semiconductor devices manufactured on a low volume basis, such as in the custom manufacture of devices or in the fabrication of devices for design and development can be accomplished at a significantly reduced cost as opposed to prior art methods.

What is claimed is:

1. An exposure system for use in the manufacture of semiconductor devices for exposing each of a plurality of levels of a single die or device dies of a semiconductor wafer to a pattern of radiation on a siteby-site exposure basis, said system comprising:
a source of said radiation;
a fixed reticle assembly between said source of radiation and said semiconductor wafer for patterning said radiation onto said semiconductor wafer, said fixed reticle assembly including a plurality of reticles arranged in a coplanar array, each said reticle having a respective different die exposure pattern;
optics means for focusing said selected one of said reticles onto said wafer, said reticle assembly being fixed within said optics means;
stepping means for incrementally moving said semiconductor wafer relative to said fixed reticle means for exposing each of said device dies, one at a time, in succession;
reticle selection means for exposing said wafer to the die exposure pattern of a selected one of said plurality of reticles;
wherein said reticle selection means includes a plurality of blades, each said blade being moveable from an initial position fully overlapping said fixed reticle assembly to a selected position to expose a correspondingly selected only one of said plurality of reticles of said coplanar array or reticles in said fixed reticle assembly.

2. A system as defined in claim 1 wherein said reticle selection means are between said source of radiation and said reticle assembly.

3. In the manufacture of semiconductor devices, a method of exposing each of a plurality of levels of a single die or device dies of a semiconductor wafer to a pattern of radiation on a site-by-site exposure basis, said method comprising the steps of:
providing a source of said radiation;
providing an optics means for focusing said radiation onto said wafer;
providing a fixed reticle assembly between said source of radiation and said semiconductor wafer, said fixed reticle assembly comprising a reticle assembly including a plurality of reticles arranged in a coplanar array with each said reticle having a respective different exposure pattern, said reticle assembly being fixed in said optics means;
selecting a given one of said reticles to expose said wafer to the die exposure pattern of said given one of said plurality of reticles; and
incrementally moving said semiconductor wafer relative to said fixed reticle assembly to expose each said device die, one at a time, in succession to the die exposure pattern of said given one of said reticles,
where said step of selecting said given one of said plurality of reticles includes providing a plurality of blades in a position fully overlapping said fixed reticle assembly, and moving each of said blades from an initially fully overlapped position to a selected position for exposing only one of said reticles of said plurality of reticles of said coplanar array.

4. A method as defined in claim 3 further including providing reticle selection means between said source of radiation and said reticle assembly.

5. An exposure system for use in the manufacture of semiconductor devices for exposing each of a plurality of levels of a single die or device dies of a semiconductor wafer to a pattern of radiation on a site-by-site exposure basis, said system comprising:
   a source of said radiation;
   a fixed reticle assembly between said source of radiation and said semiconductor wafer for patterning said radiation onto said semiconductor wafer, said fixed reticle assembly including a plurality of reticles arranged in a coplanar array, each said reticle having a respective different die exposure pattern;
   optics means for focusing said selected one of said reticles onto said wafer, said optics means having a single field of view, said reticle assembly being fixed wthin said optics means and completely filling said field of view;
   stepping means for incrementally moving said semiconductor wafer relative to said fixed reticle means for exposing each of said device dies, one at a time, in succession; and
   reticle selection means for exposing said wafer to the die exposure pattern of a selected one of said plurality of reticles.

6. In the manufacture of semiconductor devices, a method of exposing each of a plurality of levels of single die or device dies of a semiconductor wafer to a pattern of radiation on a site-by-site exposure basis, said method comprising the steps of:
   selectively irradiating a fixed reticle assembly with a source of radiation, said fixed reticle assembly comprising a reticle assembly including a plurality of reticles arranged in a coplanar array with each said reticle having a respective different die exposure pattern, said reticle assembly being fixed in said optics means, a given one of said reticles being irradiated to expose said wafer to the die exposure pattern of said given one of said plurality of reticles;
   focusing said irradiated selected reticle onto said wafer with an optical system with a single field of view, said reticle completely occupying said field of view of said optical system; and
   incrementally moving said semiconductor wafer relative to said fixed reticle assembly to expose each said device die, one at a time, in succession to the die exposure pattern of said given one of said reticles.

* * * * *